United States Patent [19]

Ho et al.

[11] Patent Number: 5,455,525

[45] Date of Patent: Oct. 3, 1995

[54] HIERARCHICALLY-STRUCTURED PROGRAMMABLE LOGIC ARRAY AND SYSTEM FOR INTERCONNECTING LOGIC ELEMENTS IN THE LOGIC ARRAY

[75] Inventors: Walford W. Ho, Saratoga; Chao-Chiang Chen, Cupertino; Yuk Y. Yang, Foster City, all of Calif.

[73] Assignee: Intelligent Logic Systems, Inc., Saratoga, Calif.

[21] Appl. No.: 162,678

[22] Filed: Dec. 6, 1993

[51] Int. Cl.⁶ .................................................. H03K 19/177
[52] U.S. Cl. .................................................. 326/41; 326/39
[58] Field of Search .................. 307/465, 465.1; 340/825.32, 825.85, 825.87; 364/716; 326/39, 41

[56] References Cited

U.S. PATENT DOCUMENTS

| | | | |
|---|---|---|---|
| 4,268,908 | 5/1981 | Logue et al. | 307/465 |
| 4,642,487 | 2/1987 | Carter | 307/465 |
| 4,847,612 | 7/1989 | Kaplinsky | 307/465 |
| 4,866,508 | 9/1989 | Eichelberger et al. | 307/465 |
| 4,870,302 | 9/1989 | Freeman | 307/465 |
| 4,942,319 | 7/1990 | Pickett et al. | 307/465 |
| 5,144,166 | 9/1992 | Camarota et al. | 307/465 |
| 5,175,865 | 12/1992 | Hillis | 364/DIG. 1 |
| 5,243,238 | 9/1993 | Kean | 307/465 |
| 5,260,610 | 11/1993 | Pederson et al. | 307/243 |
| 5,260,611 | 11/1993 | Cliff et al. | 307/465 |
| 5,296,759 | 3/1994 | Sutherland et al. | 307/465 |

OTHER PUBLICATIONS

Concurrent Logic, Inc., "CLi6000 Series Field–Programmable Gate Arrays," copyright Concurrent Logic, Inc., May 1992.

Jonathan Rose, et al., "Architecture of Field–Programmable Gate Arrays," Proceedings of the IEEE, Jul. 1993, pp. 1013–1041.

Fred Zlotnick, et al., "A High Performance Fine–Grained Approach to SRAM Based FPGAs," WESCON Conference Digest, Sep. 1993, pp. 321–326.

Primary Examiner—Edward P. Westin
Assistant Examiner—Benjamin D. Driscoll
Attorney, Agent, or Firm—Phong K. Truong; Fenwick & West

[57] ABSTRACT

A structured logic array is divided into hierarchical levels. At a highest level (the chip level), blocks are interconnected by a system of chip busses. A block interface couples each block to the chip bus system to allow the blocks to communicate with each other. At a lower level, each block includes sectors, each sector being coupled to a block bus system by a sector interface. The block bus system interconnects the sectors in each block to allow the sectors to communicate with each other. The block bus system is also coupled to the block interface to allow signals to be transferred between the block bus system and the chip bus system. At a lowest level, each sector includes a plurality of logic elements. The logic elements are interconnected by a sector bus system. The sector bus system is coupled to the sector interface to allow for the transfer of signals between the sector bus system and the block bus system.

30 Claims, 8 Drawing Sheets

HIERARCHICALLY-STRUCTURED PROGRAMMABLE LOGIC ARRAY AND SYSTEM FOR INTERCONNECTING LOGIC ELEMENTS IN THE LOGIC ARRAY

FIELD OF THE INVENTION

This invention relates to programmable logic arrays and particularly to a programmable array which is structured hierarchically to provide for higher component density, more predictable partitioning, placement, routing, and routing delay, as well as overall performance improvement.

DESCRIPTION OF THE BACKGROUND ART

Field programmable logic arrays (FPLA) are used on a regular basis for implementing and testing prototype circuits. Currently, a variety of different FPLA's are available commercially for use in design and testing. A typical FPLA includes a plurality of logic elements arranged in rows and columns, and an interconnect system for coupling electrically the various logic elements to cause the logic elements to cooperate to perform a desired function. In a typical FPLA, the interconnect system connects logic elements in a "flat" manner, that is, the interconnect system connects all of the logic elements in the same manner, without providing for structured division of the logic elements into blocks of elements.

The prior art FPLA's, although functional, have a number of significant drawbacks. These drawbacks stem mostly from the fact that the logic elements are interconnected in a substantially flat manner, and thus have no structured hierarchy. To elaborate, most circuit designs are preferably implemented in a hierarchical manner. To implement these circuit designs on conventional FPLA's, a hierarchy is created. Since the FPLA's are not themselves hierarchically structured, the hierarchy is implemented by way of the interconnect system. Creating a hierarchy using the interconnect system is not problematic when the circuit to be implemented is relatively simple; but when the circuit is not simple, very complex interconnection schemes can result.

These complex interconnection schemes, in turn, may lead to several significant problems. First, complex interconnection schemes make it very difficult to predict whether a particular FPLA will be able to implement a specific circuit. While an FPLA may have the proper number of logic elements, the interconnect resources may be insufficient to implement the desired design. It is difficult to determine, without actually implementing the design, whether the FPLA can support the implementation. This means that a user, given a circuit design, cannot determine confidently at the outset whether the circuit can actually be implemented by the FPLA. Thus, uncertainty is injected into the design process. Second, the uncertainty inherent in complex routing schemes makes it difficult to predict the routing delays imposed on signals by the interconnections. In applications where the timing of signals is critical, the FPLA may be precluded from being used to emulate the circuit. As an additional problem, the interconnection complexity increases geometrically with the number of logical elements involved in the implementation. Thus, for very complicated circuits, the prior art FPLA's may not be usable at all in the design process. In light of the shortcomings discussed above, there exists a need for an improved FPLA structure.

SUMMARY OF THE INVENTION

The invention overcomes the shortcomings of the prior art FPLA's by physically building a hierarchical structure into the FPLA; thus, design hierarchy need no longer be implemented by way of complex interconnect schemes. In the preferred embodiment, an FPLA is physically divided into at least three levels. At the highest level (the chip level), a plurality of blocks are arranged in an array of rows and columns and the blocks are interconnected by a chip bus system and a block interface. The chip bus system preferably includes a plurality of chip row busses disposed externally and adjacently to the rows of blocks, a plurality of chip column busses disposed externally and adjacently to the columns of blocks, and means for coupling selectively the chip row busses to the chip column busses. Arranged in this manner, the chip row and column busses form a bus grid which may be used for interconnecting all of the blocks of the FPLA. A block interface couples selectively each of the blocks to the chip bus system to enable the bus system to interconnect all of the blocks. Using the chip bus system, a signal may be routed from one block to any other block using a maximum of one chip row bus, one chip column bus, and a single transition or "turn" from one bus to the other.

At the next lower level (the block level), each of the blocks preferably includes a plurality of sectors arranged in rows and columns, a block bus system for interconnecting the sectors, and a sector interface. The block bus system includes a plurality of block row busses disposed externally and adjacently to the rows of sectors, a plurality of block column busses disposed externally and adjacently to the columns of sectors, and means for selectively coupling the block row busses to the block column busses to implement "turns" from block row busses to block column busses and vice versa. The sector interface couples selectively each of the sectors to the block bus system. Together, the block bus system and the sector interface interconnect all of the sectors in a block in such a manner that a signal may be routed from one sector to any other sector using a maximum of one block row bus, one block column bus, and a single turn. In addition to being coupled to the sector interface, the block bus system is also coupled selectively to the block interface to allow signals to enter from and to exit to the chip bus system.

At the lowest level (the sector level), each sector preferably includes a plurality of logic elements arranged in rows and columns, and a sector bus system for interconnecting the logic elements. The sector bus system preferably includes a plurality of sector row busses disposed adjacently to the rows of elements, a plurality of sector column busses disposed adjacently to the columns of elements, and means for selectively coupling the sector row busses to the sector column busses for implementing turns. Preferably, each of the logic elements has an input port and an output port coupled selectively to each of the sector busses to which the element is adjacent. By interconnecting the logic elements in this manner, a signal may be routed from one logic element to any other logic element using a maximum of one sector row bus, one sector column bus, and a single turn. In addition to being coupled to the various logic elements, the sector bus system is coupled to the sector interface to allow signals to enter from and to exit to the block bus system. By arranging an FPLA in the manner described above, a structural hierarchy is built into the FPLA.

This physical hierarchy is advantageous for several reasons. First, because the hierarchy is built into the FPLA, the hierarchy need not be implemented by way of complex interconnections. Thus, signal routing is significantly simplified. Second, note that at each level of the hierarchy, signal routing can be accomplished using a maximum of one row bus, one column bus, and a single turn. This makes signal paths much more predictable which, in turn, makes signal delays more predictable. Thus, the FPLA of the present invention can be used in timing-critical applications. In addition, the hierarchical structure taught herein allows for increased component density. To elaborate, notice that to increase the number of logic elements on the FPLA, all that is needed is to increase the number of blocks. Increasing the number of blocks only requires a proportional, not a geometrical, increase in the interconnect resources. Thus, unlike the prior art wherein interconnect complexity increased geometrically with the number of logic elements, the interconnect resources of the present invention only grows proportionally with the number of elements. This means that given the same amount of chip space, an FPLA constructed in the manner taught herein can have a significantly higher number of elements than the FPLA's of the prior art.

DETAILED DESCRIPTION OF THE PREFERRED EMBODIMENTS

Figure 1:
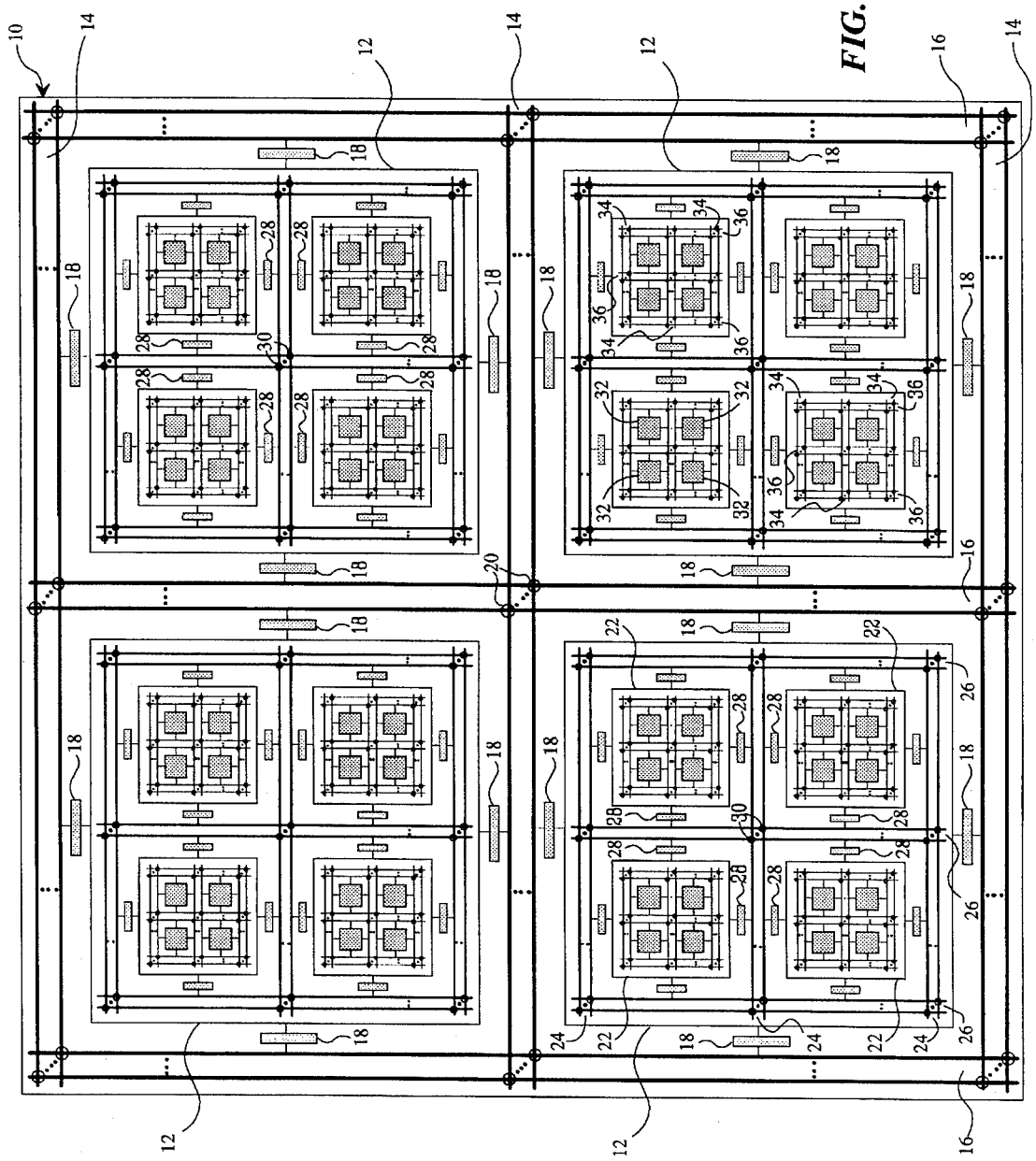
FIG. 1 is a block diagram of the overall hierarchical structure of the FPLA of the present invention.

Referring to FIG. 1, there is shown a hierarchically structured field programmable logic array (FPLA) constructed in accordance with the present invention. The invention will be described herein with reference to FPLA's but it should be noted that the concept of structured hierarchy may be implemented in many other contexts, such as in board level and multi-chip module (MCM) implementations.

The preferred embodiment shown in FIG. 1 is divided into three hierarchical levels. At the highest level (the chip level), the chip 10 comprises a plurality of blocks 12 arranged in rows and columns, a chip bus system 14, 16, and a block interface 18. The chip bus system 14, 16 and the block interface 18 serve to interconnect the various blocks 12 to allow signals to be transferred from one block to another. The chip bus system preferably comprises a chip row bus 14 having a plurality of lines, a chip column bus 16 having a plurality of lines, and coupling means 20. Preferably, bus 14 is disposed externally and adjacently to the rows of blocks 12, and bus 16 is disposed externally and adjacently to the columns of blocks 12. Busses 14 and 16 are preferably non-segmented busses which run the entire length and width of the chip 10. As shown in FIG. 1, busses 14 and 16 overlap each other in the center portion of chip 10. Coupling means 20 is placed at the points of overlap between the two busses 14, 16. Coupling means 20 preferably comprises a plurality of programmable coupling elements 20 each of which is placed at the point of overlap between a row bus line and a column bus line. The purpose of coupling means 20 is to selectively couple one of the row bus lines with one of the column bus lines so that a signal may be routed from a row bus line to a column bus or vice versa. In effect, the coupling means 20 implements a "turn" from one bus line to another to facilitate signal routing. A variety of known structures may be used to implement this coupling function. As long as the structure is programmable to connect or disconnect the two bus lines, it will function adequately as the coupling means 20. In the preferred embodiment, coupling means 20 takes the form of a plurality of pass transistors.

Block interface 18 selectively couples each of the blocks 12 to bus system 14, 16 to interconnect the various blocks 12. Signals enter into and exit out of each block 12 through interface 18. Preferably, interface 18 couples each block 12 to both the chip row bus 14 and the chip column bus. Interconnected in this manner, a signal may be routed from any block to any other block using a maximum of one chip row bus line, one chip column bus line, and a single turn. Such an interconnect system makes routing paths much more predictable which, in turn, makes signal delays more predictable.

At the next lower level in the hierarchy (the block level), each of the blocks 12 preferably comprises a plurality of sectors 22 arranged in rows and columns, a block bus system 24, 26 for interconnecting the sectors 22, and a sector interface 28 for selectively coupling each sector 22 to the block bus system 24, 26. This level in the hierarchy is quite analogous to the block level. The block bus system preferably comprises a block row bus 24 having a plurality of lines disposed externally and adjacently to the rows of sectors 22, a block column bus 26 having a plurality of lines disposed externally and adjacently to the columns of sectors 22, and a coupling means 30 for selectively coupling row bus lines to column bus lines. Like coupling means 20, the purpose of coupling means 30 is to implement a turn to allow a signal to be redirected from a row bus line to a column bus line or vice versa. Coupling means 30 may be any known programmable coupling structure but in the preferred embodiment, it takes the form of a plurality of pass transistors.

Selective coupling between each of the sectors 22 and the block bus system 24, 26 is provided by sector interface 28. Interface 28 selectively couples each sector 22 to both the block row bus 24 and the block column bus 26 to allow signals to be transferred between the sector 22 and the block bus system 24, 26. With the sectors 22 interconnected in the manner described above, signals may be transferred freely from one sector to another. In addition, a signal from any sector may be routed to any other sector using a maximum of one row bus line, one column bus line, and a single turn.

At the lowest level of the hierarchy (the sector level), each sector 22 preferably comprises a plurality of logic elements 32 arranged in rows and columns, and a sector bus system 34, 36 for interconnecting the elements. Preferably, each element has at least one input port and one output port coupled selectively to the sector bus system 34, 36. The sector bus system preferably comprises a sector row bus 34 having a plurality of lines disposed adjacently to the rows of elements, a sector column bus 36 having a plurality of lines disposed adjacently to the columns of elements, and coupling means (not shown) for selectively coupling the sector row bus lines to the sector column bus lines to implement routing turns. As with the higher levels, the interconnect system at the sector level is structured such that a signal may be routed from any element to any other element in the sector using a maximum of one row bus line, one column bus line, and a single turn.

Several important points should be noted from FIG. 1. First, notice that the number of ports decreases with each level. For example, in each block 12, each "sub-region" (sector) has four ports (each sector interface 28 being considered a port) making a total of sixteen. Externally, however, each block only has four ports (the block interfaces 18). Likewise, in each sector 22, each "sub-region" (element) has two ports making a total of sixteen ports within the sector, but externally, there are only four ports (the sector interfaces 28). This decrease in port count serves to limit interconnect complexity as the number of logic elements in the FPLA increases. Thus, unlike the prior art, interconnect complexity does not increase geometrically with the number of logic elements. A practical consequence of this is that an FPLA constructed with the hierarchical structure disclosed herein can have higher component density than the prior art FPLA's given the same amount of chip space. Another point to note is that at each level of the hierarchy, signal routing is achieved using a maximum of one row bus line, one column bus line, and a single turn. Such a routing scheme greatly reduces interconnect complexity, which results in faster and improved performance. Further, the routing scheme of the present invention is advantageous because it is much more predictable than that used in the prior art. Since it is known that a signal may be routed using no more than two bus lines and a single turn at each level, a user generally knows from the outset how signals will be routed. Because routing paths are more predictable, signal delays are also more predictable. Overall, the hierarchical nature of the present invention gives rise to significant advantages over the prior art.

FIG. 1 provides an overview of the FPLA of the present invention. For the purpose of illustration, chip 10 is shown as having four blocks 12, each block having four sectors 22, each sector having four elements 32. It should be noted, however, that the number of blocks, sectors, and elements may vary without departing from the scope of the invention. Also, the FPLA 10 of FIG. 1 is shown as having three levels, but it should be noted that the FPLA of the present invention may have any number of levels from two upwards to infinity. Thus, the scope of the invention should not be limited by the specific embodiment illustrated herein.

Figure 2:
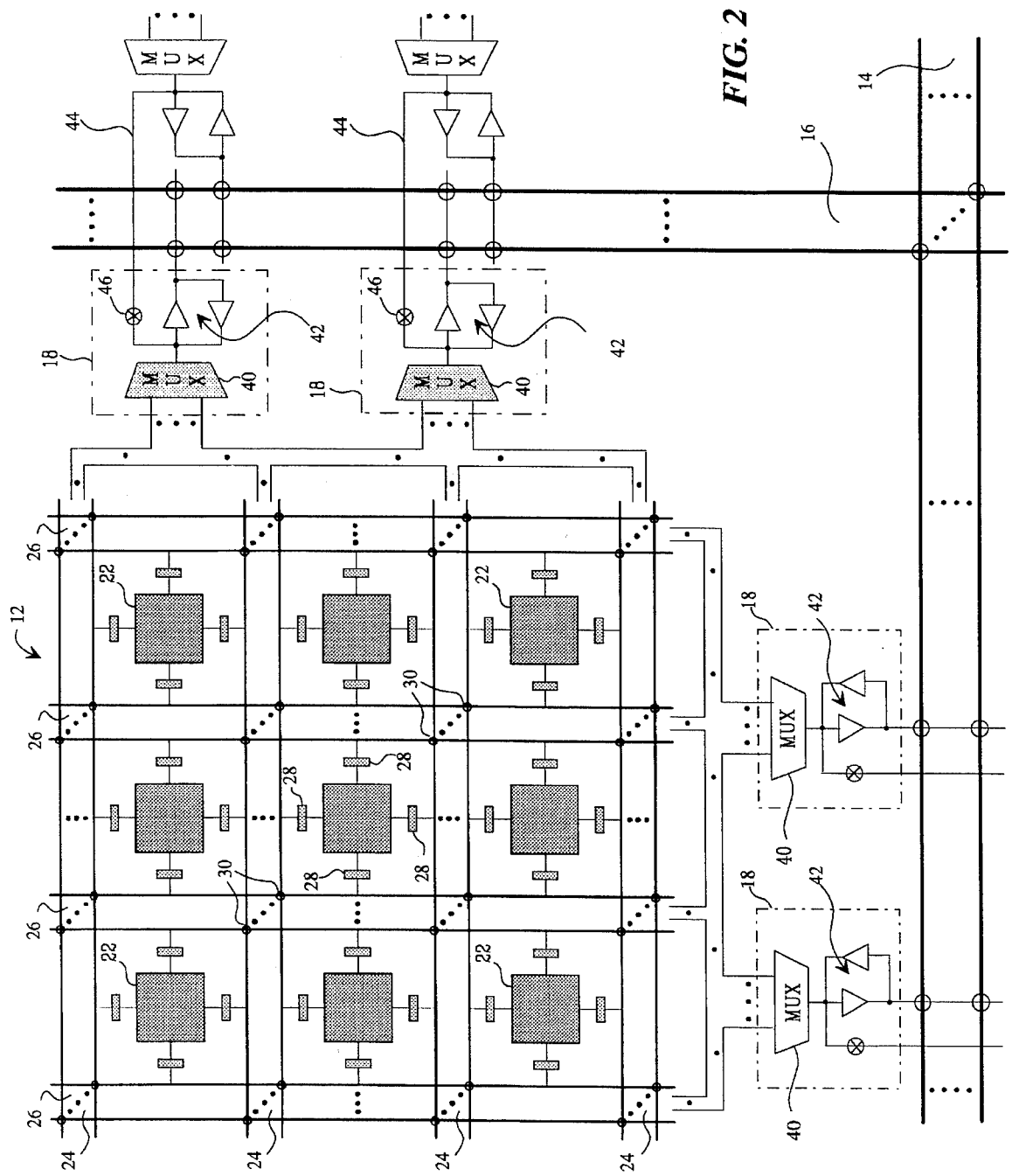
FIG. 2 is a detailed diagram of a block 12 and the block interface 18 of the present invention.

With reference to FIG. 2, the structure of each block 12 and the interface between each block 12 and the chip bus system 14, 16 will now be described in greater detail. FIG. 2 depicts a block 12 having nine sectors 22 arranged in an array of rows and columns. The sectors 22 are interconnected by a block bus system comprising a plurality of block row busses 24, each having a plurality of lines, a plurality of block column busses 26, each having a plurality of lines, and coupling means 30 for selectively coupling a block row bus 24 to a block column bus 26. In the preferred embodiment, busses 24 and 26 are non-segmented busses which run the entire width and length of the block 12. As shown in FIG. 2, busses 24 and 26 overlap each other at various locations. Preferably, coupling means 30 comprises a plurality of pass transistors each of which is placed at a point of overlap between a row bus line and a column bus line, and each of which may be programmed to either decouple or couple a row bus line to a column bus line. These pass transistors allow signals to be routed from a row bus line to a column bus line and vice versa to implement turns.

As shown in FIG. 2, each of the block row busses 24 is preferably disposed externally and adjacently to at least one row of sectors 22, and each of the block column busses 26 is disposed externally and adjacently to at least one column of sectors 22. The busses 24, 26 which run through the middle portion of the block 12 are adjacent to two rows or columns of sectors 22, while the busses which run along the boundary of the block 22 are adjacent to only one row or column of sectors 22. Arranged in this manner, busses 24 and 26 form an interconnect grid which surrounds the sectors 22 to provide for flexible intra-block routing of signals. To enable the sectors 22 to take advantage of the block bus system 24, 26, sector interface 28 selectively couples each sector 22 to each of the busses to which the sector 22 is adjacent. As shown in FIG. 2, this requires that sector interface 28 couple each sector 22 to two block row busses 24 and to two block column busses 26. With the sectors 22 interconnected in this manner, it is now possible to route a signal from any sector to another sector using no more than one row bus line, one column bus line, and a single coupling between the row and column bus lines.

The block structure as described thus far allows signals to be conveniently routed from sector to sector within the block 12. However, to transfer signals from one block to another, block interface 18 and chip bus system 14, 16 are employed. Block interface 18 preferably comprises a plurality of multiplexer/driver combinations. Each multiplexer (MUX) 40 preferably has an input port which is coupled to one or more of the bus lines 24, 26, and an output port. Each bi-directional driver 42 has a first port coupled to the output port of a MUX 40, and a second port programmably coupled (by way of pass transistors) to some or all of the lines on the chip busses 14, 16. By coupling one of the bus lines 24, 26 through a MUX 40 to the first port of a corresponding driver 42, and then enabling the driver 42, signals may be driven from block 12 onto busses 14, 16, or in the alternative, signals may be driven into the block 12 from busses 14, 16. Thus, block interface 18 provides "higher level" ports (higher in the hierarchy than the sector ports 28) through which signals may enter and exit block 12. Once a signal enters block 12 through one of these higher level ports 18, the signal may be routed to any of the sectors or "sub-regions" in the block 12 by way of the block bus system 24, 26.

At this point, it should be noted that MUX 40 in the preferred embodiment acts somewhat differently than a conventional multiplexer. A typical multiplexer is a uni-directional device (i.e. can drive signals in only one direction). In contrast, MUX 40 is a bi-directional device capable of passing signals from block 12 onto the busses 14, 16, and from busses 14, 16 into the block 12. Thus, in actuality, MUX 40 performs both a multiplexing and a demultiplexing function. For the sake of convenience, however, MUX 40 will be referred to herein as simply a multiplexer.

An additional aspect of block interface 18 to note is the direct line 44 coupling the block interfaces 18 of two adjacent blocks 12. As shown in FIG. 2, this direct line 44 may be severed or connected by setting pass transistor 46. While line 44 is not required for the present invention to function properly, it is desirable because it provides a mechanism whereby signals may be quickly and easily transferred from one block to another. Line 44 lessens the need to use busses 14, 16 for block to block routing, which reduces traffic on busses 14, 16.

Figure 3:
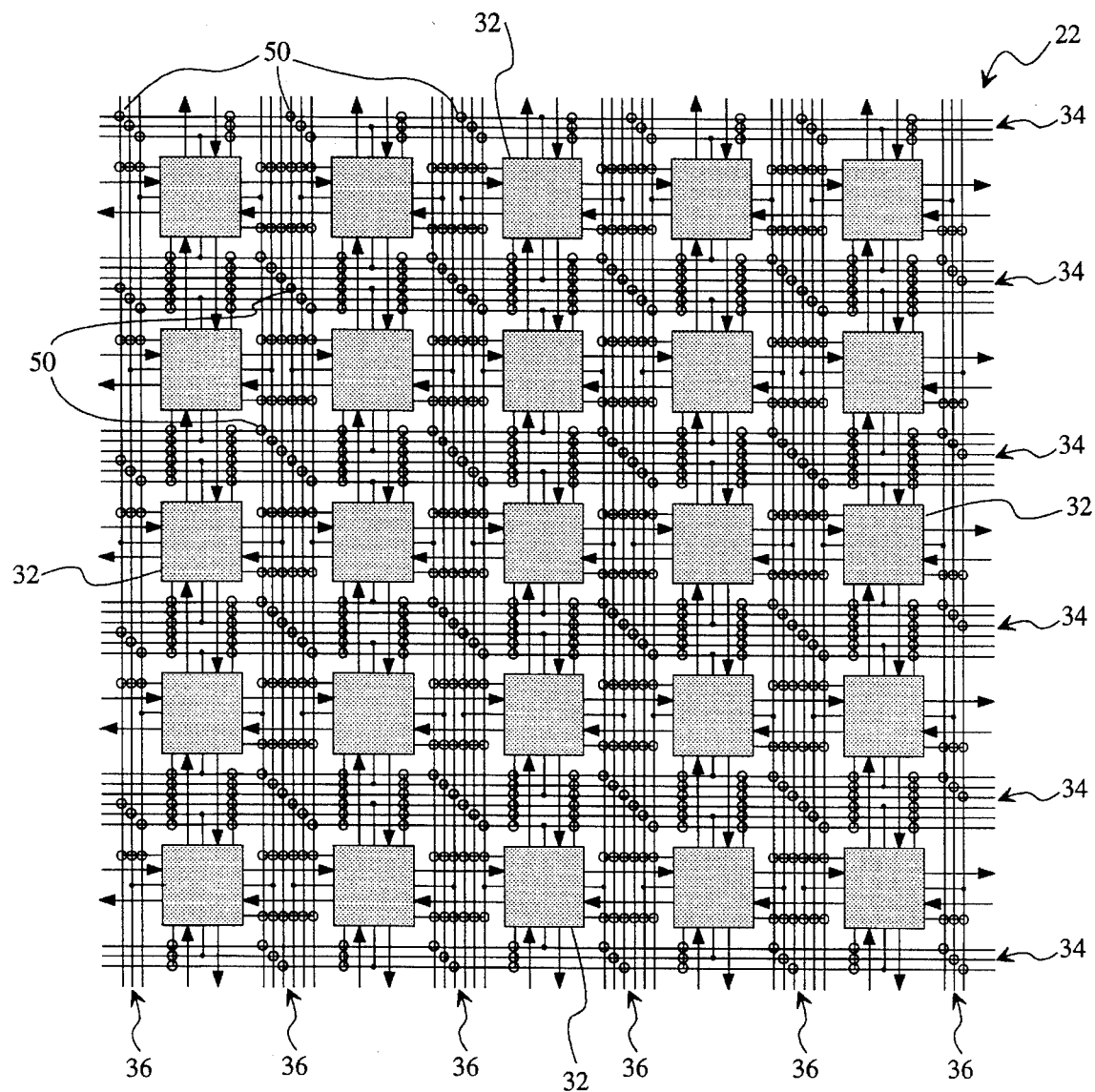
FIG. 3 is a detailed diagram of a sector 22 in accordance with the present invention.

With reference to FIG. 3, the structure of each of the sectors 22 will now be described in greater detail. In the sector 22 depicted in FIG. 3, twenty-five logic elements 32 are arranged in rows and columns. The elements 32 are interconnected by way of a sector bus system 34, 36. The sector bus system preferably comprises a plurality of sector row busses 34, each disposed adjacently to at least one row of elements, and a plurality of sector column busses 36, each disposed adjacently to at least one column of elements. Busses 34 and 36 are preferably nonsegmented busses which run the entire length and width of the sector 22. In the preferred embodiment shown in FIG. 3, each sector row bus 34 and each sector column bus 36 running through the middle section of sector 22 has six bus lines, while each of the busses 34, 36 on the boundaries of sector 22 has only three bus lines. Such a configuration has been found to be desirable. However, if desired, other configurations may be used without departing from the spirit of the present invention. Together, the sector row busses 34 and the sector column busses 36 form an interconnect grid which surrounds the elements 32.

The sector bus system 34, 36 further comprises a plurality of programmable coupling means 50 for selectively coupling the sector row bus lines to the sector column bus lines. As shown in FIG. 3, each coupling means 50 is disposed at the point of overlap between a sector row bus line and a sector column bus line. Coupling means 50, when programmed to couple a row bus line to a column bus line, implements a "turn" from a row bus line to a column bus line to facilitate signal routing. A variety of known structures may be used to implement this coupling function. As long as the structure is programmable to connect or disconnect the two bus lines, it will function adequately as the coupling means 50. In the preferred embodiment, coupling means 50 takes the form of a pass transistor. Due to the orthogonal manner in which the sector busses 34, 36 are arranged, and the manner in which the row bus lines may be coupled to the column bus lines (using coupling means 50), a signal may be routed from any element to any other element within the sector 22 using a maximum of one row bus line, one column bus line, and a single turn. This makes for predictable routing paths and predictable signal delays.

Figure 4:
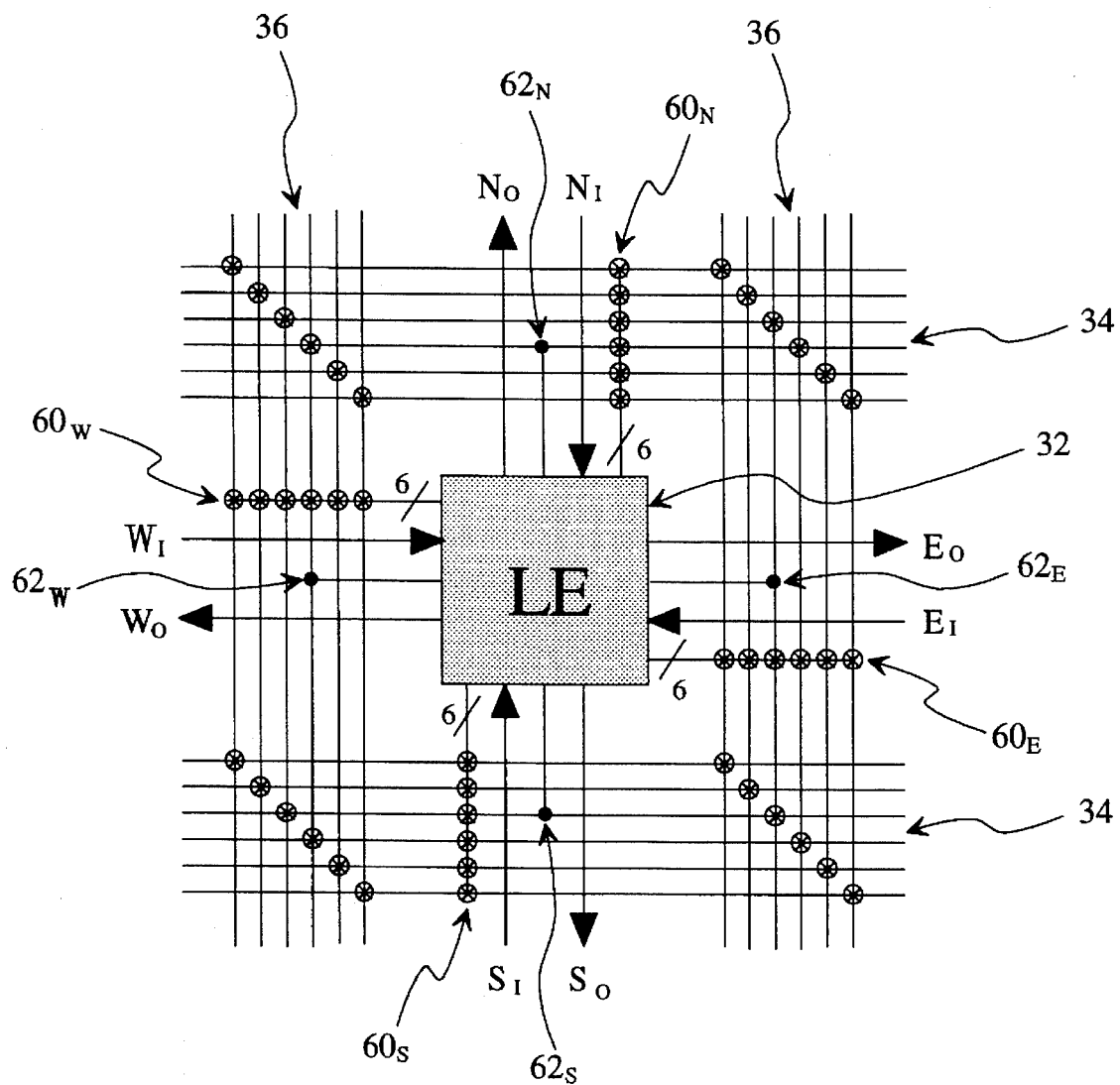
FIG. 4 is a detailed diagram illustrating the connections between an element 32 of the present invention and the adjacent bus lines.

To take full advantage of the interconnect resources, each element 32 preferably has an input port and an output port coupled to each of the busses 34, 36 to which the element is adjacent. To further enhance interconnection capability, each element 32 preferably has an input port selectively coupled to an output port of each of its four adjacent neighbors, and each element 32 preferably has its output ports selectively coupled to an input port of its four adjacent neighbors. This is shown more clearly in FIG. 4, wherein a single element 32 is depicted to highlight its connections to the sector busses 34, 36, and the surrounding elements. As shown in FIG. 4, element 32 has an input port and an output port coupled to each of the busses 34, 36 surrounding the element 32. Specifically, input port $60_N$ is selectively coupled to each of the bus lines to the "north" of the element, input port $60_E$ is selectively coupled to each of the bus lines to the "east" of the element, input port $60_S$ is selectively coupled to each of the bus lines to the "south" of the element, and input port $60_W$ is selectively coupled to each of the bus lines to the "west" of the element. While input ports $60_N$, $60_E$, $60_S$, $60_W$ are selectively coupled to the adjacent bus lines 34, 36, these selectively couplings are not implemented by way of pass transistors in the preferred embodiment. Instead, multiplexers are used. This will be elaborated upon in a subsequent section.

Element 32 also has an output port selectively coupled to a bus line of each of the adjacent busses 34, 36. In particular, output port $62_N$ is selectively coupled to a bus line to the "north" of the element 32, output port $62_E$ is selectively coupled to a bus line to the "east" of the element 32, output port $62_S$ is selectively coupled to a bus line to the "south" of the element 32, and output port $62_W$ is selectively coupled to a bus line to the "west" of the element 32. The particular bus line to which each output port is coupled is a matter of design choice. Preferably, the selective coupling between the output ports and the bus lines is implemented using pass transistors.

In addition to being coupled to the bus lines 34, 36, each element 32 is also preferably coupled to its four adjacent neighbors to the north, east, south, and west. Thus, output $N_o$ is sent to the neighbor to the north, output $E_o$ is sent to the neighbor to the east, output $S_o$ is sent to the neighbor to the south, and output $W_o$ is sent to the neighbor to the West. Likewise, element 32 receives as inputs the outputs of the four adjacent neighbors. Hence, element 32 receives inputs $N_I$, $E_I$, $S_I$, and $W_I$ from the neighbors to the north, east, south, and west, respectively. Interconnecting the elements 32 to the sector bus system 34, 36 and to each other in the manner described imparts to the FPLA of the present invention significant flexibility in routing signals from one element 32 to another within the same sector 22.

The sector interconnect system described above effectively routes signals within the sector 22, but to route signals into and out of the sector 22, sector interface 28 is employed. The interface between the sector 22 of FIG. 3 and a block column bus 26 is illustrated in greater detail in FIG. 5. The interface between sector 22 and a block row bus 24 is not shown, but such an interface is substantially identical to that shown in FIG. 5.

In the preferred embodiment, sector interface 28 comprises a plurality of MUX/driver combinations 28. Each MUX 70 preferably has an input port coupled to a plurality of the bus lines on the sector row busses 34, and an output port. Each bi-directional driver 72 preferably has a first port coupled to the output of a corresponding MUX 70, and a second port programmably coupled to a plurality of column bus lines on the block column bus 26. The programmable couplings between the bi-directional drivers 72 and block column bus 26 are preferably implemented by way of pass transistors. Using sector interface 28, a signal may be driven into or out of sector 22 by first coupling one of the bus lines on busses 34 (through a MUX 70) to the first port of a driver 72, and then activating the driver 72 to drive the signal either into the sector 22 or onto block column bus 26. Thus, sector interface 28 provides "higher level" ports through which signals may pass to allow sector 22 to communicate with other sectors via busses 24 and 26. An important point to note here is that once a signal passes through one of the higher level ports 28, that signal may be routed to any of the elements 32 or "sub-regions" within the sector 22 using the sector bus system 34, 36. Thus, in routing a signal from an element in one sector to an element in another sector, the block busses 24 and 26 are used only to route the signal from sector interface 28 (or higher level port) to sector interface 28. Once the signal enters a higher level port in the destination sector, it is the sector bus system which is used to route the signal to a specific element 32. This routing scheme significantly simplifies the signal routing process.

Figure 5:
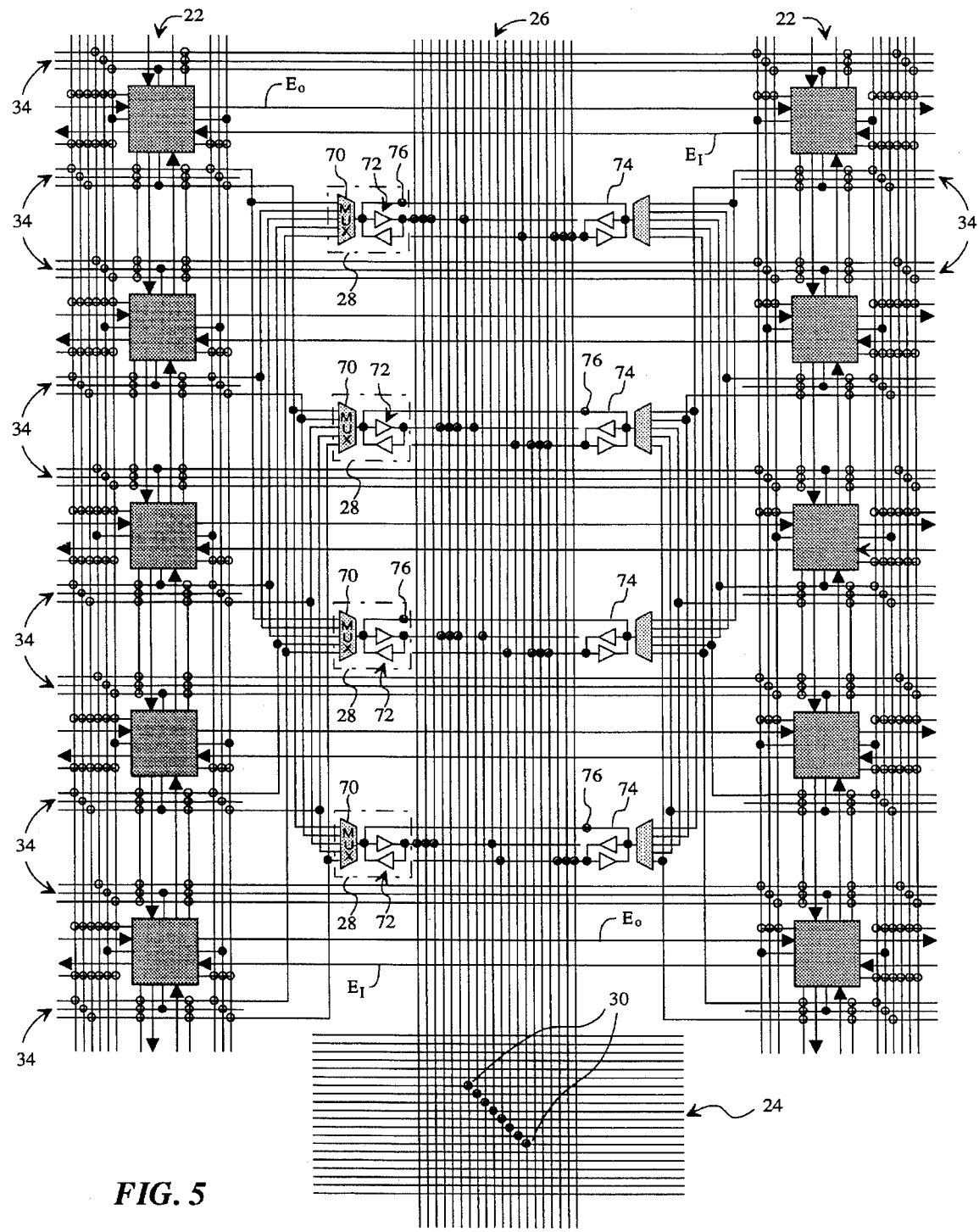
FIG. 5 is a detailed diagram of the sector interface of the present invention.

For the most part, signals are transferred from sector to sector using the block busses 24, 26. If desired, inter-sector signals may be routed using the block busses exclusively. This is within the contemplation of the present invention. However, to enhance interconnect capability and to reduce demand on busses 24, 26, neighboring elements, even those in separate sectors, are preferably connected. Recall that each element 32 receives inputs from, and sends outputs to, its four neighboring elements. This remains true even where the elements reside in separate sectors. Consequently, input lines $E_I$ and output lines $E_o$ extend across the sector-sector boundaries to directly couple neighboring elements. To further enhance interconnect capability, each sector interface 28 preferably has a direct connection line 74 to an adjacent sector interface, as shown in FIG. 5. Pass transistors 76 are used to complete or to sever the links 74 between adjacent sector interfaces 28. Lines 74 allow adjacent sectors to bypass bus 26 to transfer inter-sector signals directly, which simplifies signal routing and reduces the load on busses 24, 26.

Thus far, the present invention has been described as comprising a plurality of logic elements 32 without specifying a specific structure for the elements. This is because a wide variety of logic elements may be used to implement the hierarchically structured FPLA of the present invention. However, one logic element which is particularly suited for use in the present invention is the logic element 32 shown in FIG. 6. Element 32 is a four-input, one-output logic element which is capable of performing most four-input functions. Element 32 is preferred because it is "hard-wired", and thus, operates quickly, and because it is sufficiently versatile to perform a variety of logic functions.

Figure 6:
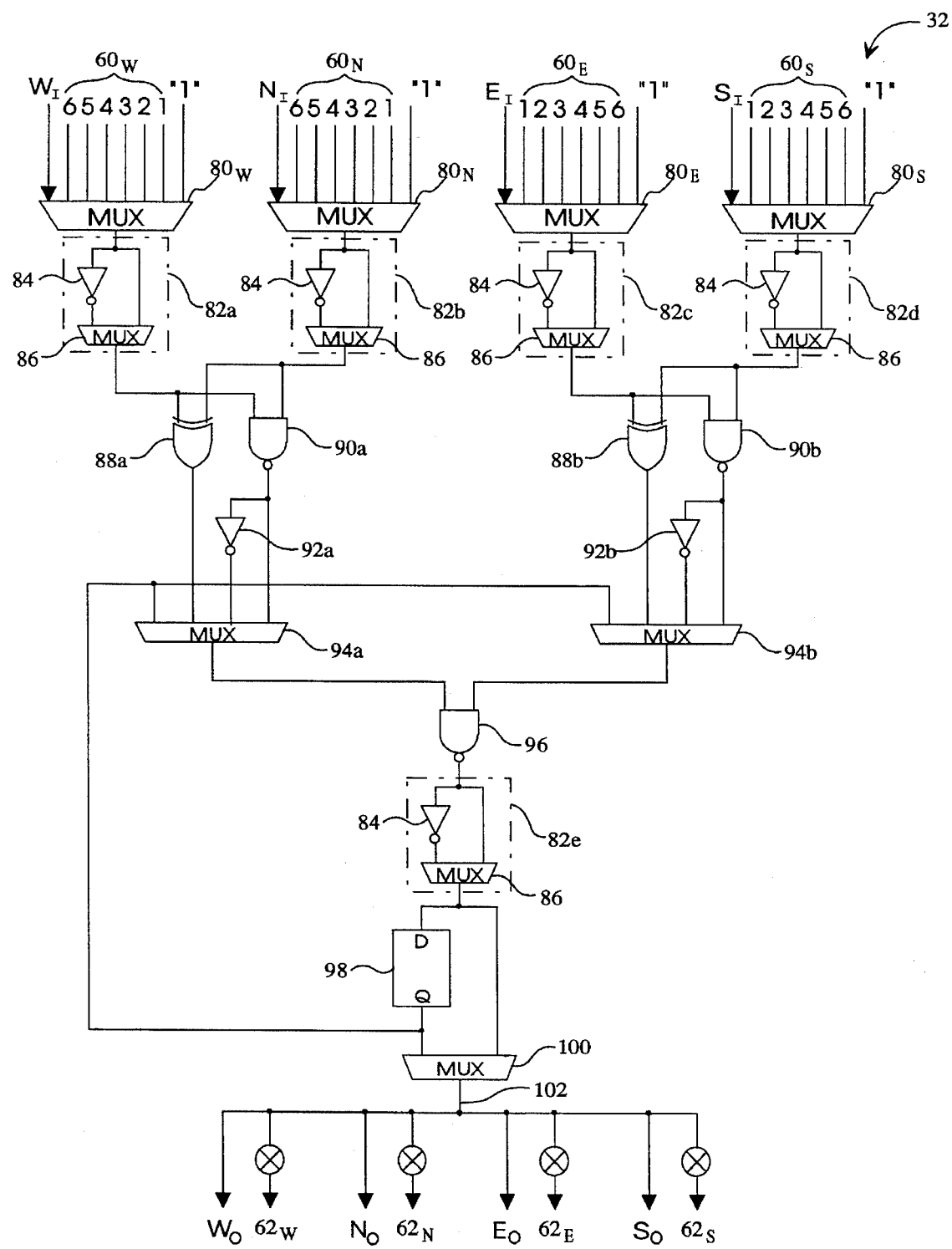
FIG. 6 is a circuit diagram of a logic element which may be used to implement the FPLA of the present invention.

With reference to FIG. 6, logic element 32 will now be described in detail. As stated above, element 32 is a four-input device. However, while only four inputs are actually accepted, thirty-two possible inputs are received at the input ports of the multiplexers $80_W$, $80_N$, $80_E$, $80_S$. Mux $80_W$ receives all of the inputs originating from the "west" side of the element 32, mux $80_N$ receives all of the inputs originating from the "north" side of the element 32, mux $80_E$ receives all of the inputs originating from the "east" side of the element 32, and mux $80_S$ receives all of the inputs originating from the "south" side of the element. To more clearly show where these possible inputs are coming from, reference is made to FIG. 4. As shown in FIG. 4, element 32 receives seven possible inputs from the west side. A first input is $W_I$ coming from the neighbor to the west, and the other six inputs are the six bus lines in bus 36. These seven possible inputs are represented in FIG. 6 as the inputs $W_I$, 6, 5, 4, 3, 2, and 1 to the mux $80_W$. The eighth input to mux $80_W$ is simply a logic "1" from a signal source (not shown). The other three multiplexers $80_N$, $80_E$, $80_S$ receive their inputs in substantially the same manner from the north, east, and west sides of the element 32, respectively. Which of the inputs is actually passed on to the output of each mux is determined by select signals sent to the control port (not shown) of each of the multiplexers $80_W$, $80_N$, $80_E$, $80_S$. These select signals are set by the user. Each of the signals appearing at the output of a mux $80_W$, $80_N$, $80_E$, $80_S$ is an input signal to the element 32.

In addition to multiplexers $80_W$, $80_N$, $80_E$, $80_S$, element 32 further comprises a plurality of programmable inverters 82a, 82b, 82c, 82d, each receiving one of the input signals. Each of the programmable inverters 82a, 82b, 82c, 82d preferably comprises an inverter 84 having an input for receiving one of the inputs signals, and an output, and a multiplexer 86. As inputs, each of the multiplexers 86 receives one of the input signals as well as the output of one of the inverters 84. Based on the status of a select signal received at a control port (not shown), each mux 86 outputs one of the two signals received at its input.

Element 32 further comprises two XOR gates 88a, 88b, two NAND gates 90a, 90b, and two inverters 92a, 92b. XOR gate 88a and NAND gate 90a receive the outputs from programmable inverters 82a and 82b, while XOR gate 88b and NAND gate 90b receive the outputs from programmable inverters 82c and 82d, and inverter 92a receives the output from NAND gate 90a while inverter 92b receives the output from NAND gate 90b. The outputs from XOR gate 88a, NAND gate 90a, inverter 92a and feedback flip-flop 98 are in turn coupled to the input port of mux 94a. Similarly, the outputs from XOR gate 88b, NAND gate 90b, inverter 92b and feedback flip-flop 98 are coupled to the input port of mux 94b. Each of the multiplexers 94a and 94b, in response to select signals received at a control port (not shown), passes one of the signals received at its input port to its output port.

Thereafter, NAND gate 96 receives the outputs of multiplexers 94a and 94b, and provides an output to programmable inverter 82e. Programmable inverter 82e in turn provides an output to mux 100 and to the D terminal of feedback flip-flip 98. Mux 100 receives the outputs of flip-flop 98 and programmable inverter 86 and, in response to select signals received at a control port (not shown), passes one of these output signals on to its output port 102. The output of mux 100 represents the output of logic element 32. This output 102 is sent out as $W_o$, $N_o$, $E_o$, and $S_o$ to the four elements adjacent to element 32. Output 102 is also selectively coupled to four adjacent bus lines as shown in FIG. 4. Thus, output 102 is connectable to a total of eight locations. This allows output 102 to be easily and conveniently routed to a number of desired locations.

Figure 7:
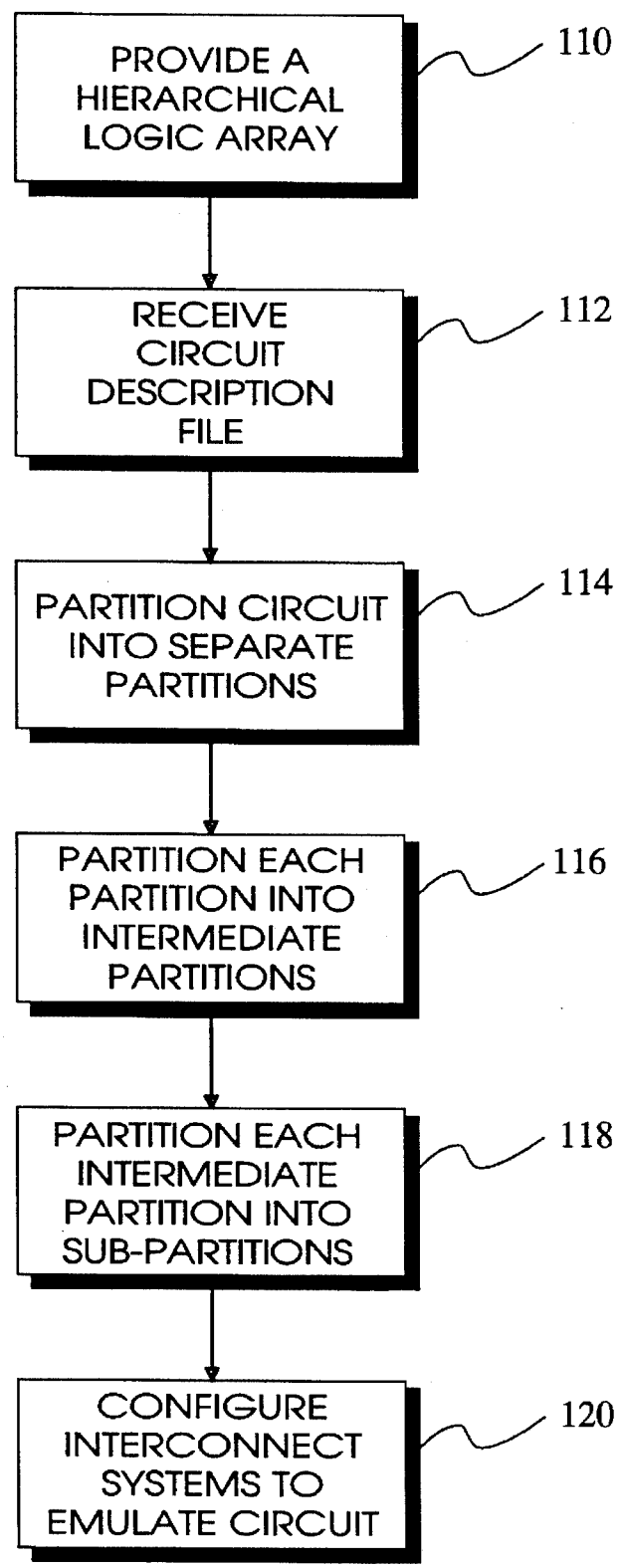
FIG. 7 is a flow diagram of a method which may be used to implement a desired circuit on the FPLA of the present invention.

The FPLA 10 (FIG. 1) of the present invention as described above provides a useful tool for implementing desired circuit designs. In order to implement a specific circuit, FPLA 10 needs to be properly configured. FIG. 7 provides a flow diagram of a process which may be used to configure FPLA 10 in a top-down manner. The method illustrated in FIG. 7 assumes that the logic array to be configured is FPLA 10 having three hierarchical levels (chip, block, and sector). It should be noted, however, that the concepts taught herein may be applied to configure any logic array having two or more hierarchical levels. Such applications are within the scope of the present invention.

Referring now to FIG. 7, the first step 110 in the process is to provide a hierarchically structured logic array such as FPLA 10 having a structured division of logic elements into distinct sections, and having a separate interconnect system for each level of the hierarchy. After the logic array is provided, a circuit description file for a desired circuit is received 112. This file may be a typical circuit description file which contains information relating to the characteristics of the components in the circuit and the manner in which these components are interconnected. Usually, no particular hierarchy is inherent in a circuit description file. Consequently, a user (or a mechanism used to configure the logic array, such as a computer program) is free to determine how the desired circuit should be divided hierarchically.

The process of dividing a circuit into separate sections is known as partitioning. In the method shown in FIG. 7, three partitioning steps are performed, one for each level of the hierarchy. In the first partitioning step 114, the desired circuit is partitioned into a plurality of separate partitions, each partition being "mapped" or assigned to a particular one of the blocks 12 of FPLA 10. For efficiency reasons, each block 12 preferably has a partition mapped to it; however, this is not required. In carrying out step 114, each block 12 having a partition mapped to it is analyzed for three criteria. First, the block 12 and the partition are analyzed against each other to determine whether the block has sufficient logical capacity to carry out the logical functions required by the partition. Second, the block 12 and the partition are analyzed to determine whether the block has a sufficient number of ports to transfer signals into and out of the block to implement the partition. Third, the block 12 and the partition are analyzed to determine whether the interconnect resources within the block are sufficient to implement the partition. In other words, a routing feasibility analysis is performed. If all of the criteria are satisfied, then the partition is mapped to the block 12.

After the partitions are mapped to corresponding blocks 12, each of the partitions is further partitioned 116 into intermediate partitions, each intermediate partition being mapped to a corresponding sector 22. In step 116, each sector 22 having an intermediate partition mapped to it is analyzed against its corresponding intermediate partition to determine whether the sector has sufficient logical capacity to perform the functions required by the intermediate partition. In addition, the sector 22 and intermediate partition are analyzed to determine whether the sector has a sufficient number of ports to transfer signals into and out of the sector to implement the corresponding intermediate partition. Furthermore, a routing feasibility analysis is performed to determine whether the interconnect resources in the sector 22 are sufficient to implement the intermediate partition. If all of the criteria are satisfied, then each intermediate partition is mapped to a corresponding sector 22.

Thereafter, each of the intermediate partitions is further partitioned 118 into a plurality of sub-partitions, with each sub-partition being mapped to a corresponding logic element 32. Preferably, by the time this level of the hierarchy is reached, the logical function required by each sub-partition is sufficiently simple such that the function may be performed by a single logic element 32. To ensure that this is the case, each logic element 32 is analyzed to determine whether it is capable of performing the function required by a corresponding sub-partition, and to determine whether it has a sufficient number of input and output ports. When it is determined that both requirements are fulfilled, then each sub-partition is mapped to a corresponding logic element 32.

FPLA 10 is now ready to be configured 120 to emulate the desired circuit. To configure FPLA 10, two steps are carried out. First, each logic element 32 is programmed to carry out the specific function required by the sub-partition to which the logic element 32 is mapped. Recall that each element 32 in the present invention is capable of performing a plurality of different logic functions. To choose the proper function for each logic element 32, each element 32 is programmed either by a user or by a mechanism designed to configure FPLA 10, such as a computer program. For the logic element 32 (FIG. 6) of the present invention, programming is achieved by setting the select signals going into the control ports (not shown) of the multiplexers $80_W$, $80_N$, $80_E$, $80_S$, 86, 94a, 94b and 100.

The second step which is performed in configuring 120 FPLA 10 is to properly interconnect the various logic elements 32 and the various hierarchical levels to produce a circuit which emulates the desired circuit. This second step is also known as signal routing. Recall that the circuit description file contains information pertaining to the manner in which the elements of the desired circuit are interconnected. Using this information, a user or a routing mechanism (such as a computer program) can configure the sector, block, and chip interconnect systems to interconnect the logic elements 32 in accordance with the circuit description file to emulate the desired circuit. In the FPLA of the present invention, signal routing is achieved by setting the pass transistors and the multiplexers placed throughout each of the hierarchical levels and each of the interfaces between the hierarchical levels.

Figure 8:
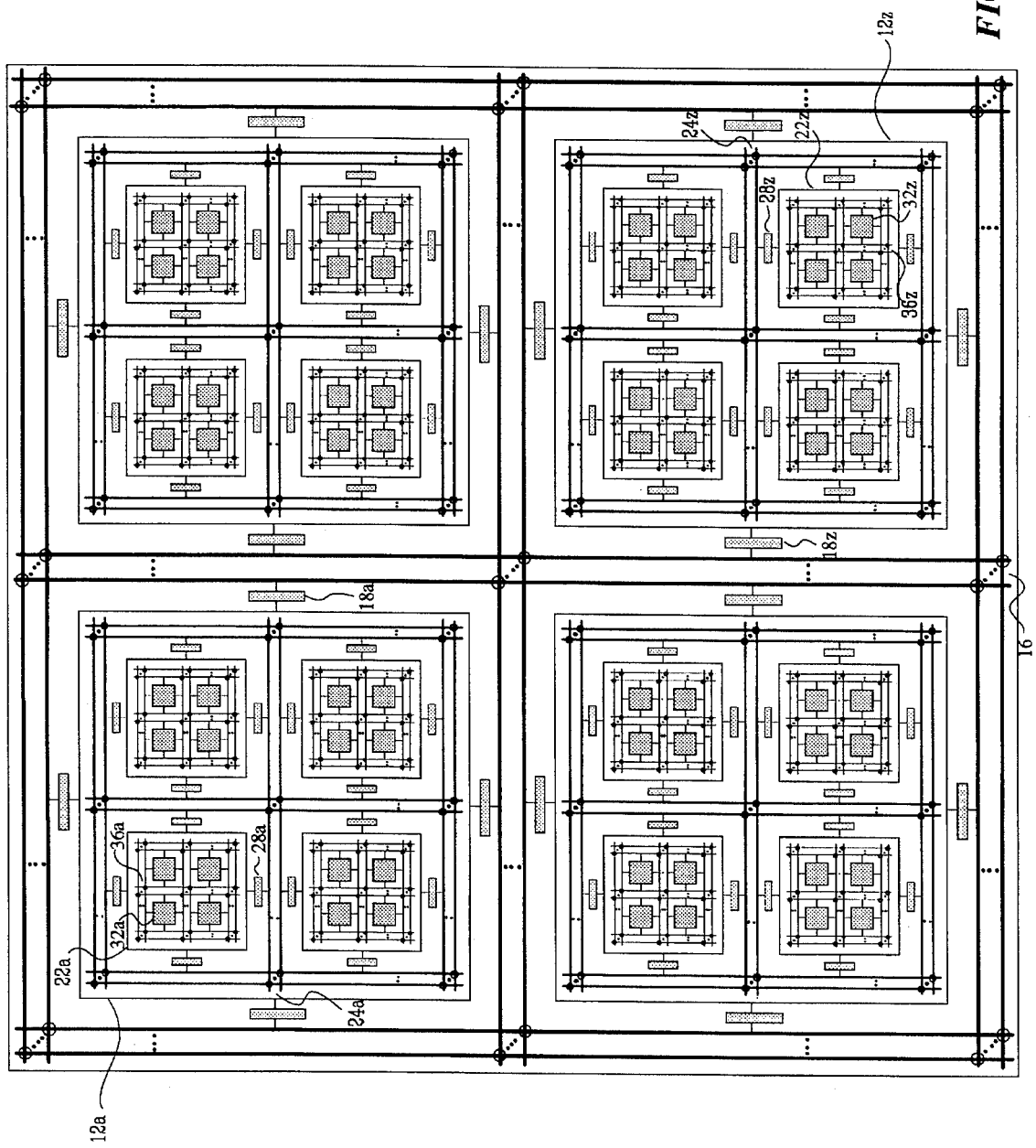
FIG. 8 is a slightly modified depiction of the FPLA of FIG. 1.

To illustrate how the output signal of a logic element in one block may be routed to an input port of another logic element in another block, reference is made to FIG. 8, which is a modified depiction of the FPLA 10 of FIG. 1. Suppose that the output of element 32a needs to be routed to an input port of element 32z. Such a signal route may be achieved by first coupling the output of element 32a to one of the bus lines in sector column bus 36a and then coupling that same bus line to interface 28a. This serves to route the output signal out of the sector 22a. Thereafter, interface 28a is coupled to one of the bus lines in block row bus 24a and this same bus line is coupled to interface 18a, which serves to route the output signal out of block 12a. Interface 18a is then coupled to one of the bus lines in chip column bus 16 and this same bus line is coupled to interface 18z, which in turn is coupled to one of the bus lines in block row bus 24z. This serves to route the output signal into the destination block 12z. Thereafter, interface 28z is coupled to the same bus line as that to which interface 18z is coupled to receive the output signal. Interface 28z, in turn, is coupled to a bus line in sector column bus 36z to route the output signal into the destination sector 22z. Finally, one of the input ports of destination element 32z is coupled to the same bus line as that to which interface 28z is coupled to receive the output signal. The signal routing is thus completed.

From the above example, it can be seen that signal routing is carried out level by level. At each level, the signal path is simple and predictable, which makes for simple overall routing and predictable timing delays. Also, because the routing paths are more predictable, the routing process is significantly simplified. Thus, not only is the FPLA of the present invention functionally superior to the prior art logic arrays, it is also easier to use.

What is claimed is:

1. A hierarchically-structured programmable logic array, comprising: a plurality of sectors, each sector comprising:

a plurality of logic cells; and a sector bus system for interconnecting said logic cells within said sector;

a block bus system disposed externally to said sectors; and an interface for selectively coupling the plurality of sector bus systems to said block bus system, said interface having a K number of lower level ports coupled to said sector bus systems, and an N number of higher level ports coupled to said block bus system, where N is less than K.

2. The programmable logic array of claim 1, wherein said interface comprises:

a multiplexer having a plurality of multiplexed ports coupled to at least one of said sector bus systems, and a de-multiplexed port; and a bi-directional driver having a first port coupled to said de-multiplexed port, and a second port selectively coupled to said block bus system.

3. The programmable logic array of claim 1, wherein at least one of said sectors comprises:

a plurality of logic cells arranged in rows and columns;

a sector bus system comprising:

at least one sector row bus disposed between two rows of said logic cells, and selectively coupled to the logic cells in said two rows; and at least one sector column bus disposed between two columns of said logic cells, and selectively coupled to the logic cells in said two columns; and means for selectively coupling at least a portion of said sector row bus to at least a portion of said sector column bus.

4. A hierarchically-structured programmable logic array, comprising:

a plurality of sectors arranged in rows and columns, each sector comprising:
a plurality of logic cells; and
a sector bus system for interconnecting said logic cells within said sector;

at least one block row bus disposed between two rows of said sectors, and adjacent to each of the sectors in said two rows such that said block row bus is accessible to each of the sectors in said two rows, and at least one block column bus disposed between two columns of said sectors, and adjacent to each of the sectors in said two columns, such that said block column bus is accessible to each of the sectors in said two columns, said block row bus and said block column bus forming at least a portion of a block bus system;

means for selectively coupling at least a portion of said block row bus to at least a portion of said block column bus; and an interface for selectively coupling the plurality of sector bus systems to said block bus system, said interface having a K number of lower level ports coupled to said sector bus systems, and an N number of higher level ports coupled to said block bus system, where N is less than K.

5. The programmable logic array of claim 4, wherein said interface comprises:

a multiplexer having a plurality of multiplexed ports coupled to at least one of said sector bus systems, and a de-multiplexed port; and a bi-directional driver having a first port coupled to said de-multiplexed port, and a second port selectively coupled to said block bus system.

6. The programmable logic array of claim 4, wherein at least one of said sectors comprises:

a plurality of logic cells arranged in rows and columns;

a sector bus system comprising:
at least one sector row bus disposed between two rows of said logic cells, and selectively coupled to the logic cells in said two rows; and
at least one sector column bus disposed between two columns of said logic cells, and selectively coupled to the logic cells in said two columns; and means for selectively coupling at least a portion of said sector row bus to at least a portion of said sector column bus.

7. A hierarchically-structured programmable logic array, comprising:

a plurality of blocks;

a chip bus system disposed external to said blocks; and a block interface for selectively coupling said blocks to said chip bus system;

wherein at least one of said blocks comprises:
a plurality of sectors arranged in rows and columns, each sector comprising:
a plurality of logic cells; and
a sector bus system for interconnecting said logic cells within said sector;
a block bus system, coupled selectively to said block interface, comprising:
at least one block row bus, disposed between and external to two rows of said sectors, accessible to each of the sectors in said two rows; and
at least one block column bus, disposed between and external to two columns of said sectors, accessible to each of the sectors in said two columns;
means for coupling at least a portion of said block row bus to at least a portion of said block column bus; and
a sector interface for selectively coupling the plurality of sector bus systems to said block bus system.

8. The programmable logic array of claim 7, wherein said sector interface has a K number of lower level ports coupled to said sector bus systems, and an N number of higher level ports coupled to said block bus system, where N is less than K.

9. The programmable logic array of claim 7, wherein said block interface has a K number of lower level ports coupled to said block bus systems, and an N number of higher level ports coupled to said chip bus system, where N is less than K.

10. The programmable logic array of claim 7, wherein at least one of said sectors comprises:

a plurality of logic cells arranged in rows and columns;

a sector bus system comprising:
at least one sector row bus disposed between and external to two rows of said logic cells, and selectively coupled to the logic cells in said two rows; and
at least one sector column bus disposed between and external to two columns of said logic cells, and selectively coupled to the logic cells in said two columns; and means for selectively coupling at least a portion of said sector row bus to at least a portion of said sector column bus.

11. The programmable logic array of claim 10, wherein said sector interface has a K number of lower level ports coupled to said sector bus systems, and an N number of higher level ports coupled to said block bus system, where N is less than K.

12. The programmable logic array of claim 10, wherein said block interface has a K number of lower level ports coupled to said block bus systems, and an N number of higher level ports coupled to said chip bus system, where N is less than K.

13. A hierarchically-structured programmable logic array, comprising:

a plurality of blocks;

a chip bus system disposed external to said blocks; and a block interface for selectively coupling said blocks to said chip bus system;

wherein at least one of said blocks comprises:
a plurality of sectors, each sector comprising:
a plurality of logic cells arranged in rows and columns;
a sector bus system comprising:
at least one sector row bus disposed between two rows of said logic cells, and selectively coupled to the logic cells in said two rows; and
at least one sector column bus disposed between two columns of said logic cells, and selectively coupled to the logic cells in said two columns; and means for selectively coupling at least a portion of said sector row bus to at least a portion of said sector column bus;

a block bus system disposed external to said sectors, said block bus system selectively coupled to said block interface; and a sector interface for selectively coupling the plurality of sector bus systems to said block bus system.

14. The programmable logic array of claim 13, wherein said sector interface has a K number of lower level ports coupled to said sector bus systems, and an N number of higher level ports coupled to said block bus system, where N is less than K.

15. The programmable logic array of claim 13, wherein said block interface has a K number of lower level ports coupled to said block bus systems, and an N number of higher level ports coupled to said chip bus system, where N is less than K.

16. An array of elements, comprising:

a plurality of elements arranged in rows and columns;

a plurality of non-segmented row busses, each disposed adjacent to at least one row of said elements, each row bus selectively coupled to an input and an output of each of the elements to which the row bus is adjacent;

a plurality Of non-segmented column busses, each disposed adjacent to at least one column of said elements, each column bus selectively coupled to an input and an output of each of the elements to which the column bus is adjacent; and means for selectively coupling at least one of said row busses to at least one of said column busses;

wherein the output of any of said elements may be coupled to the input of any of said elements using no more than one row bus, one column bus, and a single coupling between a row bus and a column bus; and wherein at least one of said elements comprises:

a first, second, third and fourth multiplexers, each multiplexer having MUX input ports for receiving input signals, and a MUX output port for transmitting a MUX output signal;

a first, second, third and fourth programmable inverters, each having an input port, an output port, and a control port, the input port of each of said programmable inverters coupled to the MUX output port of a corresponding one of said multiplexers, each of said programmable inverters responding to a control signal at its control port to provide at its output port an output signal which is either equivalent to the MUX output signal received at the input port, or is an inverted version of the MUX output signal received at the input port;

a first NAND gate having inputs and an output the inputs of said first NAND gate coupled to the outputs of said first and second programmable inverters;

a second NAND gate having inputs and an output, the inputs of said second NAND gate coupled to the outputs of said third and fourth programmable inverters;

a first XOR gate having inputs and an output, the inputs of said first XOR gate coupled to the outputs of said first and second programmable inverters;

a second XOR gate having inputs and an output, the inputs of said second XOR gate coupled to the outputs of said third and fourth programmable inverters;

a first inverter having an input and an output, the input of said first inverter coupled to the output of said first NAND gate;

a second inverter having an input and an output, the input of said second inverter coupled to the output of said second NAND gate;

a fifth multiplexer having input ports and an output port, the input ports of said fifth multiplexer coupled to the outputs of said first NAND gate, said first XOR gate, and said first inverter;

a sixth multiplexer having input ports and an output port, the input ports of said sixth multiplexer coupled to the outputs of said second NAND gate, said second XOR gate, and said second inverter; and a third NAND gate having inputs and an output, the inputs of said third NAND gate coupled to the outputs of said fifth and sixth multiplexers, the output of said third NAND gate representing an output of said element.

17. A logic cell, comprising:

a first, second, third and fourth multiplexers, each multiplexer having MUX input ports for receiving input signals, and a MUX output port for transmitting a MUX output signal;

a first, second, third and fourth programmable inverters, each having an input port, an output port, and a control port, the input port of each of said programmable inverters coupled to the MUX output port of a corresponding one of said multiplexers, each of said programmable inverters responding to a control signal at its control port to provide at its output port an output signal which is either equivalent to the MUX output signal received at the input port, or is an inverted version of the MUX output signal received at the input port;

a first NAND gate having inputs and an output, the inputs of said first NAND gate coupled to the outputs of said first and second programmable inverters;

a second NAND gate having inputs and an output, the inputs of said second NAND gate coupled to the outputs of said third and fourth programmable inverters;

a first XOR gate having inputs and an output, the inputs of said first XOR gate coupled to the outputs of said first and second programmable inverters;

a second XOR gate having inputs and an output, the inputs of said second XOR gate coupled to the outputs of said third and fourth programmable inverters;

a first inverter having an input and an output, the input of said first inverter coupled to the output of said first NAND gate;

a second inverter having an input and an output, the input of said second inverter coupled to the output of said second NAND gate;

a fifth multiplexer having input ports and an output port, the input ports of said fifth multiplexer coupled to the outputs of said first NAND gate, said first XOR gate, and said first inverter;

a sixth multiplexer having input ports and an output port, the input ports of said sixth multiplexer coupled to the outputs of said second NAND gate, said second XOR gate, and said second inverter; and a third NAND gate having inputs and an output, the inputs of said third NAND gate coupled to the outputs of said fifth and sixth multiplexers the output of said third NAND gate representing an output of said logic cell.

18. The logic cell of claim 17, further comprising: a fifth programmable inverter having an input port, an output port, and a control port, the input port of said fifth programmable inverter coupled to the output of said third NAND gate, said fifth programmable inverter responding to a control signal at its control port to provide at its output port an output signal which is either equivalent to a signal received at its input port, or is an inverted version of the signal received at its input port.

19. A hierarchically-structured programmable logic array, comprising:

a plurality of blocks arranged in rows and columns;

a chip bus system comprising:
   at least one chip row bus, disposed between and external to two rows of said blocks, accessible to each of the blocks in said two rows; and
   at least one chip column bus, disposed between and external to two columns of said blocks, accessible to each of the blocks in said two columns;
   means for coupling at least a portion of said chip row bus to at least a portion of said chip column bus; and
   a block interface for selectively coupling said blocks to said chip bus system;

wherein each of said blocks comprises:
   a plurality of sectors, each sector comprising:
      a plurality of logic cells; and
      a sector bus system for interconnecting said logic cells within said sector;
   a block bus system disposed external to said sectors, said block bus system selectively coupled to said block interface; and
   a sector interface for selectively coupling the plurality of sector bus systems to said block bus system.

20. The programmable logic array of claim 19, wherein said sector interface has a K number of lower level ports coupled to said sector bus systems, and an N number of higher level ports coupled to said block bus system, where N is less than K.

21. The programmable logic array of claim 19, wherein said block interface has a K number of lower level ports coupled to said block bus systems, and an N number of higher level ports coupled to said chip bus system, where N is less than K.

22. The programmable logic array of claim 19, wherein at least one of said sectors comprises:

a plurality of logic cells arranged in rows and columns;

a sector bus system comprising:
   at least one sector row bus disposed between and external to two rows of said logic cells, and selectively coupled to the logic cells in said two rows; and
   at least one sector column bus disposed between and external to two columns of said logic cells, and selectively coupled to the logic cells in said two columns; and means for selectively coupling at least a portion of said sector row bus to at least a portion of said sector column bus.

23. The programmable logic array of claim 22, wherein said sector interface has a K number of lower level ports coupled to said sector bus systems, and an N number of higher level ports coupled to said block bus system, where N is less than K.

24. The programmable logic array of claim 22, wherein said block interface has a K number of lower level ports coupled to said block bus systems, and an N number of higher level ports coupled to said chip bus system, where N is less than K.

25. The programmable logic array of claim 19, wherein at least one of said blocks comprises:

a plurality of sectors arranged in rows and columns, each sector comprising:
   a plurality of logic cells; and
   a sector bus system for interconnecting said logic cells within said sector; a block bus system, coupled selectively to said block interface, comprising:
      at least one block row bus, disposed between and external to two rows of said sectors, accessible to each of the sectors in said two rows; and
      at least one block column bus, disposed between and external to two columns of said sectors, accessible to each of the sectors in said two columns; and means for coupling at least a portion of said block row bus to at least a portion of said block column bus.

26. The programmable logic array of claim 25, wherein said sector interface has a K number of lower level ports coupled to said sector bus systems, and an N number of higher level ports coupled to said block bus system, where N is less than K.

27. The programmable logic array of claim 25, wherein said block interface has a K number of lower level ports coupled to said block bus systems, and an N number of higher level ports coupled to said chip bus system, where N is less than K.

28. The programmable logic array of claim 25, wherein at least one of said sectors comprises:

a plurality of logic cells arranged in rows and columns;

a sector bus system comprising:
   at least one sector row bus disposed between and external to two rows of said logic cells, and selectively coupled to the logic cells in said two rows; and
   at least one sector column bus disposed between and external to two columns of said logic cells, and selectively coupled to the logic cells in said two columns; and means for selectively coupling at least a portion of said sector row bus to at least a portion of said sector column bus.

29. The programmable logic array of claim 28, wherein said sector interface has a K number of lower level ports coupled to said sector bus systems, and an N number of higher level ports coupled to said block bus system, where N is less than K.

30. The programmable logic array of claim 28, wherein said block interface has a K number of lower level ports coupled to said block bus systems, and an N number of higher level ports coupled to said chip bus system, where N is less than K.

* * * * *